(12) United States Patent
Hotta (10) Patent No.: US 9,581,650 B2
(45) Date of Patent: Feb. 28, 2017

(54) METHOD OF ESTIMATING STATE OF CHARGE OF SECONDARY CELL, STATE-OF-CHARGE ESTIMATION DEVICE, CELL PACK, ELECTRONIC APPARATUS, AND ELECTRIC VEHICLE

(71) Applicant: Sony Corporation, Tokyo (JP)

(72) Inventor: Shin Hotta, Tokyo (JP)

(73) Assignee: Sony Corporation, Tokyo (JP)

( * ) Notice: Subject to any disclaimer, the term of this patent is extended or adjusted under 35 U.S.C. 154(b) by 195 days.

(21) Appl. No.: 13/898,864

(22) Filed: May 21, 2013

(65) Prior Publication Data

US 2013/0317697 A1 Nov. 28, 2013

(30) Foreign Application Priority Data

May 28, 2012 (JP) ................................ 2012-120455

(51) Int. Cl.
*G01R 31/36* (2006.01)
*B60L 11/18* (2006.01)

(52) U.S. Cl.
CPC ...... *G01R 31/3606* (2013.01); *B60L 11/1861* (2013.01); *G01R 31/3651* (2013.01); *B60L 2240/545* (2013.01); *B60L 2240/547* (2013.01); *B60L 2240/549* (2013.01); *B60L 2260/44* (2013.01); *G01R 31/3624* (2013.01); *G01R 31/3675* (2013.01); *Y02T 10/7005* (2013.01); *Y02T 10/705* (2013.01); *Y02T 10/7011* (2013.01); *Y02T 10/7016* (2013.01); *Y02T 10/7044* (2013.01)

(58) Field of Classification Search
CPC .................. G01R 31/3606; B60L 11/1861
USPC ........... 701/34.4; 702/63; 320/132; 324/426, 324/433
See application file for complete search history.

(56) References Cited

U.S. PATENT DOCUMENTS

| | | | | |
|---|---|---|---|---|
| 6,845,332 | B2 * | 1/2005 | Teruo | ............................... 702/63 |
| 6,987,377 | B2 * | 1/2006 | Sakakibara et al. | .......... 320/132 |
| 7,009,402 | B2 * | 3/2006 | Yumoto et al. | ............... 324/433 |
| 2004/0257087 | A1 * | 12/2004 | Murakami | .................... 324/426 |
| 2005/0017725 | A1 * | 1/2005 | Murakami et al. | ........... 324/426 |
| 2005/0073315 | A1 * | 4/2005 | Murakami et al. | ........... 324/433 |
| 2007/0029973 | A1 * | 2/2007 | Ashizawa et al. | ............ 320/132 |
| 2009/0276172 | A1 * | 11/2009 | Nishi | .............................. 702/63 |
| 2010/0000809 | A1 * | 1/2010 | Nishi et al. | ................ 180/65.29 |

FOREIGN PATENT DOCUMENTS

JP H11-204149 7/1999

* cited by examiner

*Primary Examiner* — Behrang Badii
*Assistant Examiner* — Majdi Alsomiri
(74) *Attorney, Agent, or Firm* — Chip Law Group (57) ABSTRACT

A method of estimating a state of charge of a secondary cell includes: calculating a value of $(\partial E_{emf}/\partial T)$ in advance on the assumption that $E_{emf}$ is an electromotive force of the secondary cell and T is a temperature of the secondary cell; and calculating the state of charge based on at least a value of $(\partial E_{emf}/\partial T)$ for which a value of the state of charge is set as a variable, a temperature measurement value of the secondary cell, and a current measurement value of the secondary cell.

13 Claims, 6 Drawing Sheets

METHOD OF ESTIMATING STATE OF CHARGE OF SECONDARY CELL, STATE-OF-CHARGE ESTIMATION DEVICE, CELL PACK, ELECTRONIC APPARATUS, AND ELECTRIC VEHICLE

BACKGROUND

The present disclosure relates to a method of estimating a state of charge of a secondary cell, a state-of-charge estimation device, a cell pack including the state-of-charge estimation device, an electronic apparatus, and an electric vehicle.

In consideration of user's convenience, a state of charge (SOC) is frequently estimated and displayed in secondary cells. In most of the secondary cells, the state of charge is shown at about three to five stages from a measurement result of a terminal voltage of the secondary cell. Further, secondary cells such as lithium-ion secondary cells are often used in electronic apparatuses such as personal computers, and thus the state of charge is also calculated by current integration.

In general, a state of charge can be estimated by accurately measuring an open voltage (open circuit voltage or open terminal voltage: OCV) of a secondary cell. For example, Japanese Unexamined Patent Application Publication No. 11-204149 discloses a lithium cell remaining capacity measuring method of correcting current dependency of an electromotive force of a lithium cell according to a lithium diffusion concentration gradient in an electrode of the lithium cell based on respective sampling data of the terminal voltage and current of the lithium cell, calculating an open circuit voltage of the lithium cell based on the correction result, and measuring the remaining capacity of a lithium cell based on the open circuit voltage.

SUMMARY

In the technology disclosed in Japanese Unexamined Patent Application Publication No. 11-204149, however, calculation of simultaneous differential equation or logarithm and exponent has to be performed. Therefore, a problem may arise in that a burden on an arithmetic circuit and an increase in cost of the arithmetic circuit may be caused, and charging and discharging in a constant current may not be managed.

Accordingly, it is desirable to provide a method of estimating a state of charge of a secondary cell and a state-of-charge estimation device capable of causing the amount of calculation to be small, suppressing a burden on an arithmetic circuit, and managing charging and discharging in a constant current, and estimating the state of charge with high accuracy without measurement of an open voltage of the secondary cell and provide a cell pack, an electronic apparatus, an electric vehicle including the state-of-charge estimation device.

According to an embodiment of the present disclosure, there is provided a method of estimating a state of charge of a secondary cell. The method includes: calculating a value of $(\partial E_{emf}/\partial T)$ in advance on the assumption that $E_{emf}$ is an electromotive force of the secondary cell and T is a temperature of the secondary cell; and calculating the state of charge based on at least a value of $(\partial E_{emf}/\partial T)$ for which a value of the state of charge is set as a variable, a temperature measurement value of the secondary cell, and a current measurement value of the secondary cell.

According to another embodiment of the present disclosure, there is provided a state-of-charge estimation device that calculates a state of charge of a secondary cell. The state-of-charge estimation device includes: a storage unit that stores a value of $(\partial E_{emf}/\partial T)$ on the assumption that $E_{emf}$ is an electromotive force of the secondary cell and T is a temperature of the secondary cell; a temperature measurement device that measures the temperature of the secondary cell; a current measurement device that measures a current of the secondary cell; and an arithmetic device that calculates the state of charge based on at least the value of $(\partial E_{emf}/\partial T)$ for which a value of the state of charge is set as a variable, a temperature measurement value of the secondary cell, and a current measurement value of the secondary cell.

According to still another embodiment of the present disclosure, there is a provided a cell pack including a secondary cell; and a state-of-charge estimation device that calculates a state of charge of the secondary cell. This cell pack is configured to include the state-of-charge estimation device according to the above-described embodiment of the present disclosure.

According to further still another embodiment of the present disclosure, there is a provided an electronic apparatus including: a secondary cell; and a state-of-charge estimation device calculating a state of charge of the secondary cell. This electronic apparatus estimation device is configured to include the state-of-charge estimation device according to the above-described embodiment of the present disclosure.

According to further still another embodiment of the present disclosure, there is a provided an electric vehicle including: a secondary cell; and a state-of-charge estimation device calculating a state of charge of the secondary cell. This electric vehicle estimation device is configured to include the state-of-charge estimation device according to the above-described embodiment of the present disclosure.

In the method of estimating the state of charge of the secondary cell, the state-of-charge estimation device, the cell pack, the electronic apparatus, or the electric vehicle according to the embodiments of the present disclosure, the value of $(\partial E_{emf}/\partial T)$ is calculated in advance and the state of charge is calculated based on at least the value of $(\partial E_{emf}/\partial T)$ for which the value of the state of charge (SOC) is set as a variable, the temperature measurement value of the secondary cell, and the current measurement value of the secondary cell. Therefore, the amount of calculation is small, the burden on the arithmetic circuit can be suppressed, and the charging and discharging in a constant current can be managed. Further, unlike a technology of the related art for estimating a state of charge by measuring an open voltage of the secondary cell, the state of charge is estimated directly from the measurement temperature change of the secondary cell without the measurement of the open voltage of the secondary cell. Therefore, it is not necessary for the secondary cell to remain unused for several hours and, an error rarely occurs in the calculation of the start of charge even when the secondary cell is frequently charged and discharged before a full discharge state or a full charge state.

DETAILED DESCRIPTION OF EMBODIMENTS

Hereinafter, embodiments of the present disclosure will be described with reference to the drawings, but the present disclosure is not limited to the embodiments and various numerals and substances in the embodiments are merely examples. The description will be made in the following order.

1. General Description of Method of Estimating State of Charge of Secondary Cell, State-of-Charge Estimation Device, Cell Pack, Electronic Apparatus, and Electric Vehicle according to Embodiments of Present Disclosure 2. First Embodiment (Method of Estimating State of Charge of Secondary Cell, State-of-Charge Estimation Device, Cell Pack, and Electronic Apparatus, according to Embodiment of Present Disclosure)

3. Second Embodiment (Electric Vehicle according to Embodiment of Present Disclosure)

4. Third Embodiment (Method of Estimating State of Charge of Secondary Cell Having First and Second Configurations, and the Like) and Others General Description of Method of Estimating State of Charge of Secondary Cell, State-of-Charge Estimation Device, Cell Pack, Electronic Apparatus, and Electric Vehicle according to Embodiments of Present Disclosure A method of estimating a state of charge of a secondary cell, a state-of-charge estimation device, a cell pack, an electronic apparatus, and an electric vehicle according to an embodiment of the present disclosure are sometimes generically referred to as "a method of estimating a state of charge of a secondary cell and the like according to an embodiment of the present disclosure." A state-of-charge estimation device according to an embodiment of the present disclosure, a state-of-charge estimation device in a cell pack according to an embodiment of the present disclosure, a state-of-charge estimation device in an electronic apparatus according to an embodiment of the present disclosure, and a state-of-charge estimation device in an electric vehicle according to an embodiment of the present disclosure are sometimes generically referred to as "a state-of-charge estimation device and the like according to an embodiment of the present disclosure."

In the method of estimating a state of charge of a secondary cell according to an embodiment of the present disclosure, the state of charge is calculated not only based on a value of $(\partial E_{emf}/\partial T)$ for which a value of the state of charge is set as a variable, a temperature measurement value of the secondary cell, and a current measurement value of the secondary cell, but also based on an internal resistance value of the secondary cell. Further, a "request subject" or a "correction subject" is a state-of-charge estimation device, and more specifically, an arithmetic device included in the state-of-charge estimation device. The same applies also to the following description.

The method of estimating a state of charge of a secondary cell and the like according to a preferred embodiment of the present disclosure can calculate a state of charge at time $t_1$ based on a state of charge at time $t_0$ and a current measurement value of the secondary cell from time $t_0$ to time $t_1$ can correct the state of charge at time $t_0$ so that an absolute value $\Delta T_{diff} (=|\Delta T_{real} - \Delta T_{calc}|)$ of a difference between an actual measurement temperature increase amount $\Delta T_{real}$ based on the temperature measurement value of the secondary cell from time $t_0$ to time $t_1$ and a calculated temperature increase amount $\Delta T_{calc}$ of the secondary cell from time $t_0$ to time $t_1$, which is calculated based on at least the value of $(\partial E_{emf}/\partial T)$ for which the value of the state of charge is set as the variable, the temperature measurement value of the secondary cell, and the current measurement value of the secondary cell, becomes a second predetermined value (where the second predetermined value<a first predetermined value), when the absolute value $\Delta T_{diff}$ exceeds the first predetermined value.

In the method of estimating the state of charge of the secondary cell and the like according to the preferred embodiment of the present disclosure, when a temperature change of the secondary cell is equal to or less than a temperature measurement limit of a temperature measurement device and an open voltage change of the secondary cell is equal to or less than a voltage measurement limit of a voltage measurement device, an open voltage of the secondary cell may be measured by the voltage measurement device, a temperature of the secondary cell may be measured by the temperature measurement device, and the value of $(\partial E_{emf}/\partial T)$ may be calculated based on the open voltage measurement result and the temperature measurement result. This configuration is referred to as "a method of estimating a state of charge of a secondary cell and the like with a first configuration" for convenience.

Further, in the method of estimating the state of charge of the secondary cell and the like according to the preferred embodiment of the present disclosure, the secondary cell may include a lithium-ion secondary cell. In a state in which a diffusion reaction of lithium ions does not occur, an open voltage of the secondary cell may be measured by a voltage measurement device, the temperature of the secondary cell may be measured by the temperature measurement device, and the value of $(\partial E_{emf}/\partial T)$ may be calculated based on the open voltage measurement result and the temperature measurement result. This configuration is referred to as "a method of estimating a state of charge of a secondary cell and the like with a second configuration" for convenience. In this configuration, the state in which the diffusion reaction of lithium ions does not occur may be a state in which a temperature change of the secondary cell is equal to or less than a temperature measurement limit of the temperature measurement device and an open voltage change of the secondary cell is equal to or less than a voltage measurement limit of the voltage measurement device.

Further, in the method of estimating the state of charge of the secondary cell and the like with the first or second configuration, the voltage measurement device having the voltage measurement limit of $1\times10^{-6}$ volts and the temperature measurement device having the temperature measurement limit of $1\times10^{-2}$ ° C. are preferably used, but the embodiment of the present disclosure is not limited thereto. A request of the voltage measurement limit for the voltage measurement device and a request of the temperature measurement limit for the temperature measurement device are based on order in which the value of $(\partial E_{emf}/\partial T)$ is $10^{-4}$ to $10^{-3}$.

In the method of estimating the state of charge of the secondary cell and the like with the first or second configuration (sometimes referred to as "a method of measuring $(\partial V_{OC}/\partial T)$ of a secondary cell"), when the temperature change of the secondary cell is equal to or less than the temperature measurement limit of the temperature measurement device and the open voltage change of the secondary cell is equal to or less than the voltage measurement limit of the voltage measurement device or when the diffusion reaction of lithium ions does not occur, the open voltage and the temperature of the secondary cell are measured. That is, the open voltage of the secondary cell is measured with high accuracy. Therefore, $(\partial V_{OC}/\partial T)$ can be calculated with high accuracy. Since $(\partial V_{OC}/\partial T)$ can be calculated with high accuracy, the value of $(\partial E_{emf}/\partial T)$ can be obtained with high accuracy. When the temperature change of the secondary cell is equal to or less than the temperature measurement limit of the temperature measurement device and the open voltage change of the secondary cell is equal to or less than the voltage measurement limit of the voltage measurement device or when the diffusion reaction of lithium ions does not occur, "$E_{emf}=V_{OC}$" is satisfied. Therefore, the value of $(\partial E_{emf}/\partial T)$ can be calculated based on the open voltage measurement result and the temperature measurement result. Further, the value of $(\partial E_{emf}/\partial T)$ may be stored in a storage unit included in the state-of-charge estimation device. As described above, $(\partial E_{emf}/\partial T)$ is a value for which the value of the state of charge (SOC) is set as a variable.

Examples of the secondary cell according to the embodiment of the present disclosure include a lithium-ion secondary cell, a magnesium-ion secondary cell, an aluminum-ion secondary cell, a lead storage cell, a nickel-cadmium secondary cell, and a nickel-hydrogen secondary cell, but the embodiment of the present disclosure is not limited thereto. A kind of secondary cell to be used may be selected appropriately according to necessary characteristics. The configuration or structure of the secondary cell may be an existing configuration or structure. The shape of the secondary cell may be a cylindrical shape or an angled shape. The configuration or structure of the cell pack itself may be an existing configuration or structure. The cell pack may be configured such that a plurality of secondary cell groups in which a plurality of secondary cells are connected in series to each other are connected in parallel to each other. The cell pack may be configured such that a plurality of secondary cell groups in which a plurality of secondary cells are connected in parallel to each other are connected in series to each other. The temperature measurement device and the current measurement device to be used may be an existing temperature measurement device and an existing current measurement device. The arithmetic device may include, for example, a CPU and a memory. In the method of estimating the state of charge of the secondary cell and the like with the first or second configuration, a temperature control unit controlling the temperature of the secondary cell may, for example, include a Peltier element heating or cooling the secondary cell and a temperature control unit (temperature control circuit) controlling an operation of the Peltier element.

The cell pack according to the embodiment of the present disclosure may be normally connected to a power consumption device. A wiring may be used for the connection to the power consumption device. For example, a wireless power transmission method (wireless power transmission circuit) called an electromagnetic induction method or a magnetic-field resonance method may be used. Examples of the power consumption device include an electronic device such as a personal computer, a television receiver, various display devices, a portable telephone, a PDA (Personal Digital Assistant), an electronic book, an electronic paper such as an electronic newspaper, a digital still camera or a video camera, a camcorder, or a music player, an electric power tool such as an electric power drill, an illumination equipment such as an interior lamp, an electric storage unit or a home energy server (household electric storage device), a medical equipment, and a toy, but the embodiment of the present disclosure is not limited thereto. Further, such a power consumption device can be exemplified as the electronic device according to the embodiment of the present disclosure. Examples of the electric vehicle include an electric automobile, an electric motorbike, an electric assist bicycle, a golf cart, an electric cart, and a Segway (registered trademark). The cell pack according to the embodiment of the present disclosure can be applied not only to driving of a power drive force conversion device (specifically, for example, a motor for power) of the electric vehicle but also to driving of a power drive force conversion device (specifically, for example, a motor for power) of an airplane or a ship.

An existing secondary cell charging device is used to charge the cell pack. The secondary cell charging device is normally connected to a power source. Examples of the power source include a commercial power source, power-generating device, a power grid, a smart grid (next-generation power grid). Examples of the power-generating device include a solar cell or a fuel cell, wind power generating equipment, micro-hydraulic power generating equipment, and a geothermal power generating equipment, but the embodiment of the present disclosure is not limited thereto. One power-generating device may be provided or a plurality of power-generating device may be provided. The power-generating device may be connected to the secondary cell charging device by a wiring. For example, a wireless power transmission method (wireless power transmission circuit) called an electromagnetic induction method or a magnetic-field resonance method may be used. The state-of-charge estimation device according to the embodiment of the present disclosure may be embedded in the secondary cell charging device.

The state-of-charge estimation device may be connected to a secondary cell by a communication method. In this case, examples of the communication method include a normal telephone line or a normal optical fiber line including an Internet communication network, ZigBee, a LAN, an RC232, a USB, an infrared ray including IrDA, Bluetooth (registered trademark) which is one of the protocols of a wireless LAN, HomeRF, and a combination thereof, but the embodiment of the present disclosure is not limited thereto. A personal computer can be exemplified as a part of the state-of-charge estimation device. A portable terminal including a display device may be further provided, and the state-of-charge estimation device and the portable terminal may be configured to be connected by a communication method. In this configuration, an operation state of the state-of-charge estimation device can be confirmed even at a distant place. Here, examples of the portable terminal include a portable telephone, a PDA, and a note-type personal computer, but the embodiment of the present disclosure is not limited thereto.

First Embodiment

Figure 1:
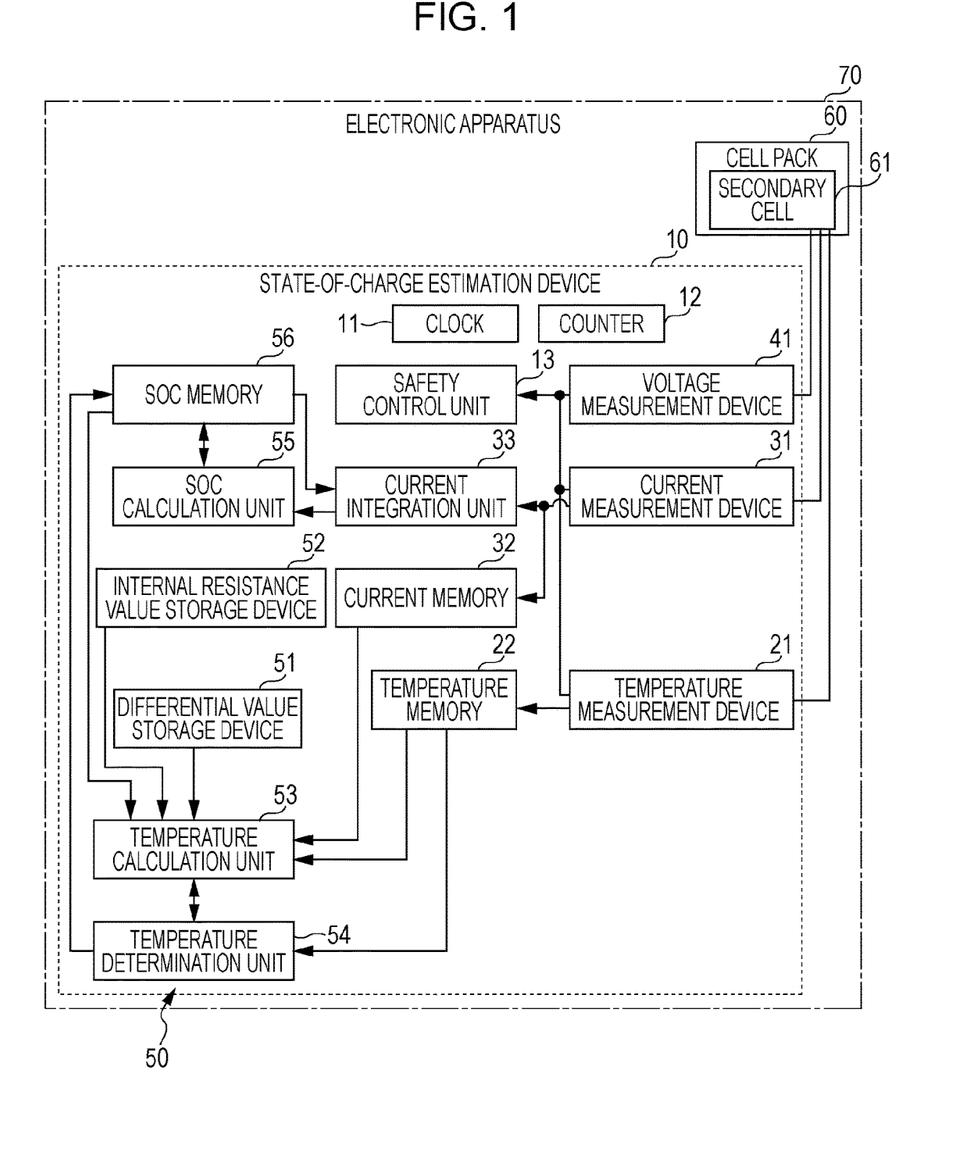
FIG. 1 is a conceptual diagram illustrating a cell pack and an electronic apparatus including a circuit diagram of a state-of-charge estimation device calculating a state-of-charge of a secondary cell according to a first embodiment.

A first embodiment of the present disclosure relates to a method of estimating a state of charge of a secondary cell, a state-of-charge estimation device, a cell pack, and an electronic apparatus. FIG. 1 is a conceptual diagram illustrating the cell pack and the electronic apparatus including a circuit diagram of the state-of-charge estimation device calculating a state of charge of a secondary cell according to the first embodiment. In the embodiment, specifically, the secondary cell includes, for example, a lithium-ion secondary cell having an existing configuration or structure.

The method of estimating the state of charge of the secondary cell according to the first embodiment includes: calculating a value of $(\partial E_{emf}/\partial T)$ in advance on the assumption that $E_{emf}$ is an electromotive force of the secondary cell and T is a temperature of the secondary cell; and calculating the state of charge not only based on at least a value of $(\partial E_{emf}/\partial T)$ for which a value of the state of charge is set as a variable, a temperature measurement value of the secondary cell, and a current measurement value of the secondary cell, but also based on an internal resistance value of the secondary cell in the first embodiment.

A heat generation amount Q of the secondary cell can be expressed by Expression (1) below on the assumption that I (which is set to a positive value at the time of charging and is set to a negative value at the time of discharging) is a current value of the secondary cell, T is a temperature of the secondary cell, $E_{emf}$ is an electromotive force of the secondary cell, and $R_{SOC}$ is a direct-current internal resistance value of the secondary cell. Since the direct-current internal resistance value of the secondary cell has dependency on SOC, the direct-current internal resistance value is denoted by $R_{SOC}$. As described above, $(\partial E_{emf}/\partial T)$ is a value for which a value of the state of charge (SOC) is set as a variable. The values of the state of charge (SOC) and the values of $(\partial E_{emf}/\partial T)$ corresponding to the value of the state of charge (SOC) are tabled and stored in a storage unit 51 to be described below. Further, the values of the state of charge (SOC) and the values of $R_{SOC}$ corresponding to the values of the state of charge (SOC) are tabled and stored in an internal resistance value storage device 52 to be described below.

$$Q = -I \cdot T \cdot \{\partial E_{emf}/\partial T\} + I^2 \cdot R_{SOC} \qquad (1)$$

On the assumption that C is a heat capacity of the secondary cell, h is an equivalent heat transfer coefficient of the secondary cell, S is a total surface area of the secondary cell, and $T_a$ is a peripheral temperature, a temperature increase amount $\Delta T(t_0, t_1)$ from time $t_0$ to time $t_1$ ($=t_0+\Delta t$) can be expressed by Expression (2) below.

$$\Delta T(t_0, t_1) = (1/C) \cdot \qquad (2)$$
$$\int [-I(t) \cdot T(t) \cdot \{\partial E_{emf}(t)/\partial T\} + I^2(t) \cdot R_{SOC}(t) - h \cdot S \cdot \{T(t) - T_a\}] dt$$

Expression (2) and Expressions (3) and (4) to be described below are expressed as indefinite integrals, but are actually definite integrals. In Expressions (2) and (4), integration is performed from time $t_0$ to time $t_1$ ($=t_0+\Delta t$). In Expression (3), integration is performed from time $t_0$ to time $t$ (where $t \le t_1$).

Here, when the value $SOC_{t-0}$ of the SOC at time $t_0$ can be accurately obtained, the temperature increase amount $\Delta T(t_0, t_1)$ can be calculated by reading the value of $(\partial E_{emf}/\partial T)$ and the value of $R_{SOC}$ at the value $SOC_{t-0}$ from the storage unit 51 and the internal resistance value storage device 52, respectively, and using actually measured values as a current I(t) and a temperature T(t). Further, SOC(t) at time t can be calculated by Expression (3) on the assumption that $C_C$ is a storable capacity of the secondary cell. Expression (3) is nothing but the calculation of the state of charge by current integration.

$$SOC(t) = SOC_{t-0} + (1/C_C) \int I(t) dt \qquad (3)$$

When an estimated value of the state of charge by the current integration contains an error at time $t_0$, a temperature increase amount $\Delta T'(t_0, t_1)$ from time $t_0$ to time $t_1$ ($=t_0+\Delta t$) is calculated by Expression (4) below, and thus is different from the actual temperature increase amount $\Delta T(t_0, t_1)$. Further, $\partial E_{emf}'(t)/\partial T$ and $R_{SOC}'(t)$ are temperature differential values of the electromotive force $E_{emf}$ of the secondary cell and the direct-current internal resistance value of the secondary cell obtained based on the estimate value of the state of charge containing an error. Hereinafter, the temperature differential value of the electromotive force $E_{emf}$ of the secondary cell is sometimes referred to as a "temperature differential value $(\partial E_{emf}(t)/\partial T)$."

$$\Delta T'(t_0, t_1) = (1/C) \cdot \qquad (4)$$
$$\int [-I(t) \cdot T(t) \cdot \{\partial E_{emf}'(t)/\partial T\} + I^2(t) \cdot R_{SOC}'(t) - h \cdot S \cdot \{T(t) - T_a\}] dt$$

For example, by calculating the temperature increase amount $\Delta T(t_0, t_1)$ at time $t_1$ using a value from 0% to 100% as $SOC_{t-0}$ at time $t_0$ and setting (correcting or substituting), to $SOC_{t-0}$ at time $t_0$, a value obtained as a value closest to the actual measurement temperature increase amount $\Delta T_{real}$ which is based on the temperature measurement value of the secondary cell from time $t_0$ to time $t_1$, it is possible to remove or reduce the error of the SOC accumulated by the current integration.

Figure 3A:
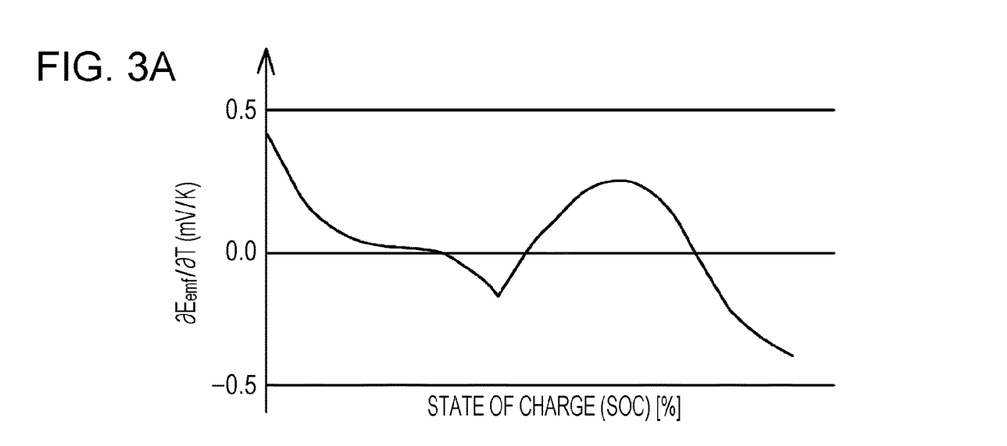
FIGS. 3A, 3B, and 3C are a graph schematically illustrating a temperature differential value $(\partial E_{emf}/\partial T)$ of an electromotive force $E_{emf}$ of the secondary cell, a graph schematically illustrating a relation between a value of the state of charge and the electromotive force $E_{emf}$, and a diagram schematically illustrating a change state of a current integrated error as a time elapses, respectively.

In practice, an amount of calculation can be reduced by contriving a scheme, for example, performing calculation within the maximum error range assumed in the current integration or calculating the temperature increase again using a value of the SOC estimated from the initial temperature increase calculation error. The value of $\partial E_{emf}/\partial T$ or the value of $R_{SOC}$ corresponds to the values of a plurality of SOC in some cases. However, in the cases, it is more realistic to use a value closest to the SOC obtained by the current integration. FIG. 3A schematically illustrates a temperature differential value $(\partial E_{emf}/\partial T)$. In FIG. 3A, the horizontal axis represents a value of the SOC. FIG. 3A illustrates a case in which the temperature differential value $(\partial E_{emf}/\partial T)$ corresponds to the values of a plurality of SOC.

Figure 3B:
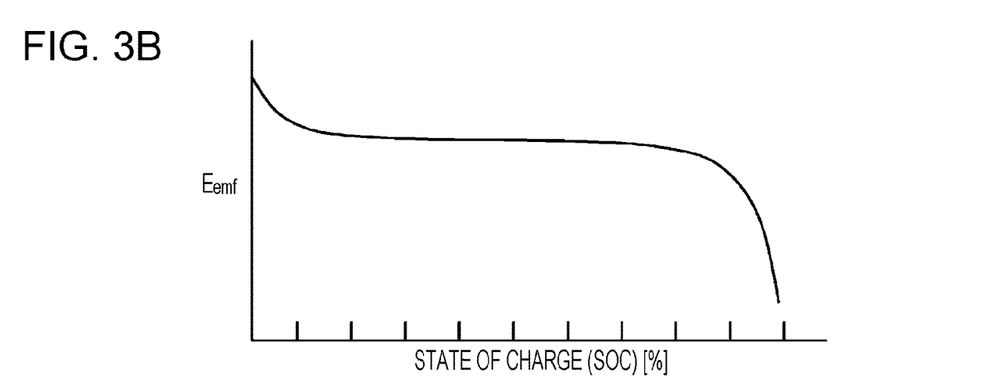

In general, as illustrated in FIG. 3B, when the value of the SOC is in the range of 0% to 20% and the range of 80% to 100%, a change ratio of the electromotive force $E_{emf}$ to the SOC is large. Therefore, even when a slight error is present in the estimation of the electromotive force $E_{emf}$, the estimation error of the SOC is small. Accordingly, a method of estimating the state of charge of the secondary cell according to the first embodiment may be applied to a case in which the value of the SOC is assumed to be in the range of 20% to 80%. Since SOC dependency of an internal resistance value R is generally small in this range, the direct-current internal resistance value R of the secondary cell is often regarded as a constant value, and thus an amount of calculation can be reduced. That is, the state of charge can be calculated based on a value of $(\partial E_{emf}/\partial T)$ for which a value of the state of charge is set as a variable, a temperature measurement value of the secondary cell, and a current measurement value of the secondary cell.

Figure 3C:
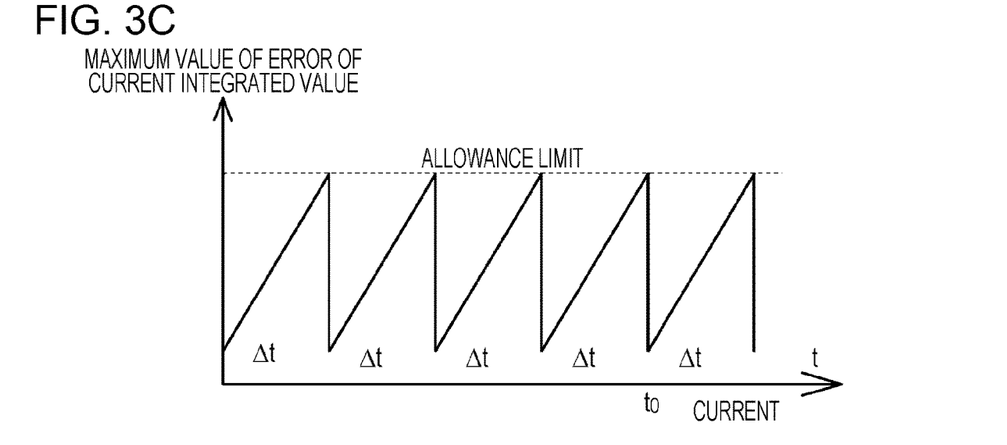

The estimation of the state of charge may not be regularly performed and may be performed at intervals of an expected time at which a current integration error exceeds an allowance value. That is, as illustrated in FIG. 3C, $\Delta t$ described above may be set to the expected intervals of the time at which a current integration error exceeds an allowance value, and the calculation may be performed by setting a time earlier by $\Delta t$ than the current time as time $t_0$.

By estimating the state of charge directly from the temperature change of the secondary cell in this way, it is not necessary to estimate the electromotive force and only the four arithmetic operations may be performed. Therefore, since an amount of calculation can be reduced, it is possible to reduce a burden on an arithmetic circuit. Further, a direct-current internal resistance value of the secondary cell according to the first embodiment can also be applied to a secondary cell in which the change amount of a voltage to a state of charge is small.

As illustrated in the circuit diagram of FIG. 1, the state-of-charge estimation device 10 that calculates a state of charge of the secondary cell according to the first embodiment includes: a storage unit (differential value storage unit) 51 that stores a value of $(\partial E_{emf}/\partial T)$ for which $E_{emf}$ is assumed to be an electromotive force of a secondary cell 61 and T is assumed to be a temperature of the secondary cell 61; a temperature measurement device (temperature measurement circuit) 21 that measures a temperature of the secondary cell 61; a current measurement device (current measurement circuit) 31 that measures a current of the secondary cell 61; and an arithmetic device 50 that calculates the state of charge based on at least the value of $(\partial E_{emf}/\partial T)$ for which a value of the state of charge (SOC) is set to a variable, a temperature measurement value of the secondary cell 61, and the current measurement value of the secondary cell 61.

An electronic apparatus 70 according to the first embodiment is an electronic apparatus that includes the secondary cell 61 and a state-of-charge estimation device that calculates the state of charge of the secondary cell 61. The state-of-charge estimation device is configured to include the state-of-charge estimation device 10 according to the first embodiment of the present disclosure. Further, the electronic apparatus 70 may be configured to include a cell pack 60 according to the first embodiment. A personal computer can be exemplified as the electronic apparatus 70. A central arithmetic processing unit or the like can be exemplified as an electronic component (power consumption device) included in the electronic apparatus 70. In FIG. 1, the state-of-charge estimation device 10 is enclosed by a dotted line and the electronic apparatus is enclosed by a one-dot chain line.

The state-of-charge estimation device 10 is configured to be able to obtain information on a voltage, a current, and a temperature of the secondary cell 61. Specifically, for example, the state-of-charge estimation device 10 is configured to include one printed-wiring board on which an LSI or a memory is mounted. The state-of-charge estimation device 10 and the secondary cell 61 can be accommodated together to form the cell pack 60 in a housing. The state-of-charge estimation device 10 includes a temperature measurement device 21, a temperature memory 22, a current measurement device 31, a current memory 32, a current integration unit 33, a voltage measurement device (voltage measurement circuit) 41, an arithmetic device 50, and a storage unit (differential value storage unit) 51. The arithmetic device 50 includes an internal resistance value storage device 52, a temperature calculation unit 53, a temperature determination unit 54, an SOC calculation unit 55, and an SOC memory 56. The state-of-charge estimation device 10 further includes a clock 11, a counter 12, and a safety control unit 13 to perform the whole control.

In each secondary cell 61, as will be described in detail below in a third embodiment, an electromotive force $E_{emf}$ of the secondary cell 61 and a temperature differential value [the value of $(\partial E_{emf}/\partial T)$ for which a value of the state of charge (SOC) is set to a variable] of the electromotive force $E_{emf}$ of the secondary cell 61 are measured in advance, tabled, and stored in the differential value storage unit 51. The direct-current internal resistance value $R_{SOC}$ of the secondary cell 61 for which a value of the state of charge (SOC) is set to a variable is measured in advance, tabled, and stored in the internal resistance value storage device 52. The equivalent heat transfer coefficient h of each secondary cell 61 is also derived and stored in the internal resistance value storage device 52. Examples of a method of deriving the equivalent heat transfer coefficient h of the secondary cell include a method of performing temperature measurement through experimental charging and discharging and a method of performing the calculation through thermo-fluid analysis (for example, analysis using a commercially available thermo-fluid analysis program such as ANSYS CFD, CD-adapco STAR-CCM+, Autodesk Simulation CFD, FLOW-3D).

Figure 2A:
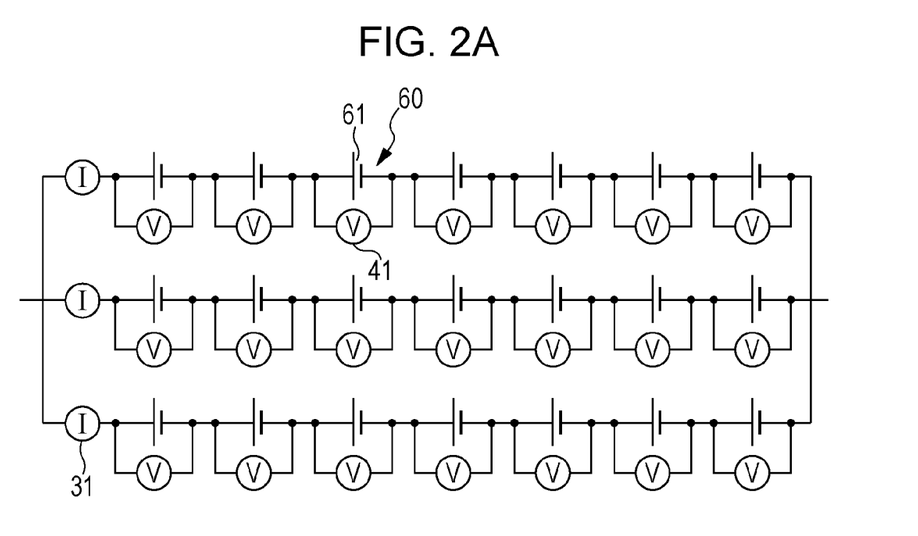
FIGS. 2A and 2B are a conceptual diagram of the cell pack according to the first embodiment and a diagram illustrating the configuration of a hybrid vehicle according to a third embodiment, respectively.

The cell pack according to the first embodiment includes the secondary cell 61 and the state-of-charge estimation device 10 that calculates the state of charge of the secondary cell 61 according to the first embodiment. As illustrated in the conceptual diagram of FIG. 2A, the cell pack 60 has a configuration in which three secondary cell groups in which seven secondary cells 61 with a rated voltage of 3.7 volts (a charge voltage of 4.2 volts and a discharge cutoff voltage of 2.5 volts) and a rating capacity of 2000 mAh are connected in series to each other are connected in parallel to each other. That is, the voltage of the entire cell pack is rated 25.9 volts and the rating capacity of the entire cell pack is 6000 mAh. A thermocouple (not illustrated) is mounted on each secondary cell 61. When a field-effect transistor (FET) for safety (not illustrated) is mounted on each of the secondary cell groups connected in series, the field-effect transistor enters an OFF state at the time of abnormal occurrence so that no current flows in the secondary cell groups connected in series. In a configuration in which the secondary cell groups in which the plurality of secondary cells 61 are connected in series to each other are connected in parallel to each other, the number of voltage measurement devices 41 is necessary by the number of secondary cells 61. However, the number of current measurement devices 31 may be provided by the number of secondary cell groups. On the other hand, in a configuration in which the secondary cell groups in which the plurality of secondary cells 61 are connected in parallel to each other are connected in series to each other, the number of current measurement devices 31 is necessary by the number of secondary cells 61. However, the number of voltage measurement devices 41 may be provided by the number of secondary cell groups.

A voltage measurement range of the voltage measurement device 41 is, for example, in the range of 0 volts to 5 volts. When the number of AD conversion bits is set to 12, a resolution is 1.2 millivolts. A current measurement range of the current measurement device 31 is, for example, in the range of −12 amperes to +12 amperes. When the number of AD conversion buts is set to 14, a resolution is 1.46 milliamperes. A temperature measurement range of the temperature measurement device 21 is, for example, in the range of 0° C. to 60° C. When the number of AD conversion bits is set to 12, a resolution is 0.015° C.

Figure 4A:
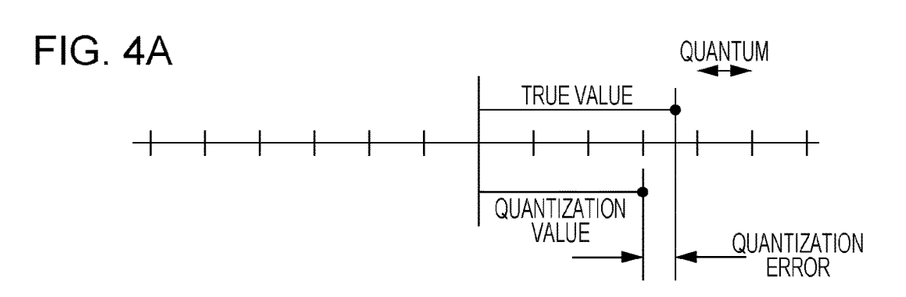
FIGS. 4A, 4B, 4C, 4D, and 4E are diagrams illustrating a quantization error of AD conversion.
Figure 4B:
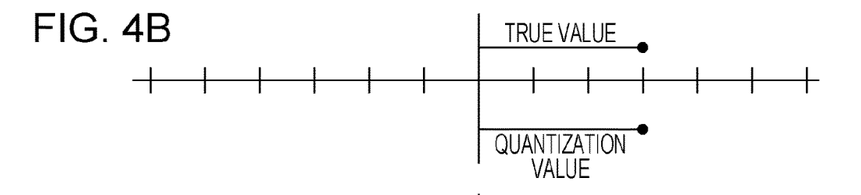
Figure 4C:
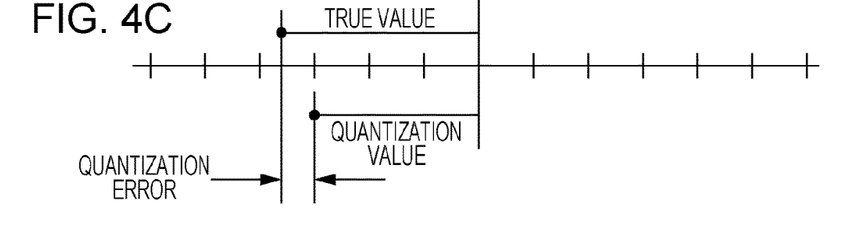
Figure 4D:
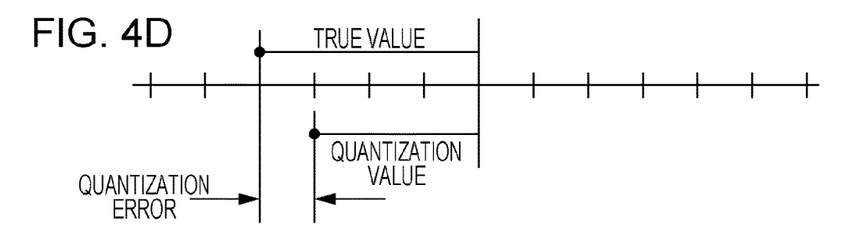
Figure 4E:
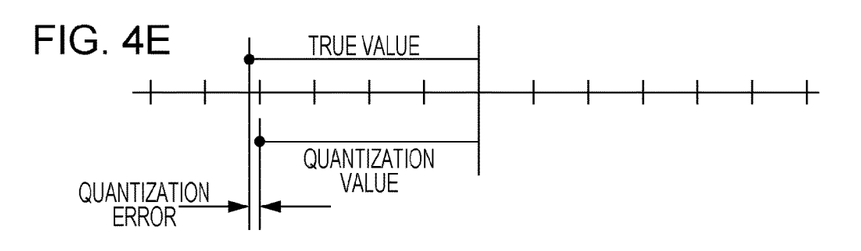

Hereinafter, a quantization error of AD conversion will be described. FIGS. 4A and 4B are diagrams illustrating a relation between a true value and a quantization value for a given measurement value. A scale indicates the minimum unit when a measurement value is subjected to AD conversion, that is, a quantum. Therefore, the quantization value is necessarily an integer multiple of the quantum. In the AD conversion, as illustrated in FIG. 4A, when a true value is any positive value, a value which is a value equal to or less than the true value and is the closest the true value among values of integer multiples of the quantum is set to the quantization value. Accordingly, as illustrated, a quantization error occurs. FIG. 4B illustrates a case in which the true value is the same as an integer multiple of the quantum. At this case, the quantization error is 0. Accordingly, an expected value of the quantization error is half of the quantum when the true value is any positive value. When the measurement value is a negative value, as illustrated in FIG. 4C, a value obtained by adding the quantum to a value which is equal to or less than the true value and is the closest to the true value among values of integer multiples of the quantum is set to the quantization value. FIG. 4D illustrates a case in which the true value is the same as an integer multiple of the quantum. In this case, the quantization error is the maximum. However, when even slight deviation from an integer multiple of the quantum occurs, as illustrated in FIG. 4E, the quantization value is changed. Accordingly, an expected value of the quantization error is half of the quantum when the true value is any negative value. However, the direction is opposite to the direction when the true value is positive.

When the integration of the current measurement value of the secondary cell 61 is performed, an error is accumulated due to the fact that the calculation is performed in addition to the quantization error. Since the current measurement value is a positive or negative value, the quantization errors are cancelled mutually by repeating charging and discharging only by the same amount during the integration. However, here, on the assumption of constant charging or constant discharging which is the most disadvantageous state, the quantization error at the time of the integration of the current measurement value is considered to be stacked.

As described above, the quantum of the current measurement value is 1.46 milliamperes. Accordingly, an average quantization error is 0.73 milliamperes. The worst case will be assumed. That is, it is assumed that an error of 0.73 milliamperes occurs at every current measurement. When intervals of a current measurement time is set to 2 seconds and an allowance SOC error is set to ±3% (±60 mAh since the rating capacity of the secondary cell 61 is 2000 mAh), deviation corresponding to 58.4 mAh occurs in the current measurement of 80 times. Accordingly, it is necessary to correct the state of charge (SOC) every 160 seconds.

In the state-of-charge estimation device 10, the counter 12 increases every occurrence of the clock 11. When the count value of the counter 12 is within a defined value, the state-of-charge estimation device 10 measures a voltage, a current, and a temperature of the secondary cell 61 every clock. Then, the safety control unit 13 determines each value. When any one value is not within a desired range, it is determined that an abnormality occurs in the secondary cell 61, a field-effect transistor (not illustrated) enters an OFF state, and thus no current flows in the secondary cell groups connected in series. Here, for example, the desired range of the voltage is equal to or greater than 2.5 volts and equal to or less than 4.2 volts, the desired range of the current is equal to or greater than −10 amperes and equal to or less than +10 amperes, and the desired range of the temperature is equal to or greater than 10° C. and equal to or less than 50° C.

When the values are within the desired ranges, the current integration unit 33 performs the current integration of the current measurement value and the measured current measurement value (currently measured current measurement value) is added and stored in the current memory 32. The SOC calculation unit 55 calculates the value of the current SOC from the current integrated value of the current integration unit 33 and a $SOC_{memory}$, which is the value of the SOC stored in the SOC memory 56. Here, intervals ($t_{clock}$) of occurrence of the clock is set to 2 seconds and a defined value (count) of the count value is set to 80.

The state of charge at time $t_1$ is calculated based on the state of charge at time $t_0$ and a current measurement value of the secondary cell from time $t_0$ to time $t_1$. Specifically, when the count value of the counter 12 reaches the defined value, that is, 80, the temperature measurement value of the secondary cell 61 at this time is added and stored in the temperature memory 22. The temperature calculation unit 53 reads the previous temperature, that is, a temperature measured before 80 times of the clock, from the temperature memory 22. The temperature calculation unit 53 calculates a temperature increase amount $\Delta T_{calc}$ from discrete Expressions (5) and (6) equivalent to Expressions (2) and (3). At this time, the temperature calculation unit 53 reads the value of the $SOC_{memory}$ stored in the SOC memory 56, substitutes the value into SOC(j) [where j=1], reads data corresponding to 80 times of the clock from the current memory 32, and performs calculation with reference to the differential value storage unit 51 and the internal resistance value storage device 52. A suffix "j" indicates a positive integer from 1 to the defined value (count) of the count value. $I_j$ and $T_j$ denote a current measurement value and a temperature measurement value of the secondary cell 61 when a time from time $t_0$ to ($t_{clock} \times j$) passes, respectively. Further, $\{\partial E_{emf}(j)/\partial T\}$, $R_{SOC}(j)$, and SOC(j) are a temperature differential value ($\partial E_{emf}(t)/\partial T$), a direct-current internal resistance value of the secondary cell 61, and a value of the SOC when a time from time $t_0$ to ($t_{clock} \times j$) passes, respectively. The SOC(j) may be obtained from Expression (6), and the value of $\{\partial E_{emf}(j)/\partial T\}$ and the value of $R_{SOC}(j)$ in the value of the obtained SOC(j) may be read from the differential value storage unit 51 and the internal resistance value storage device 52. Further, "Σ" means a process of performing a sum from "j=1" to "j=count (=80)".

$$\Delta T_{calc} = \quad (5)$$
$$(t_{clock}/C) \cdot \sum [-I_j \cdot T_j \cdot \{\partial E_{emf}(j)/\partial T\} + I_j^2 \cdot R_{SOC}(j) - h \cdot S \cdot \{T_j = T_a\}]$$

$$SOC(j+1) = SOC(j) + (1/C_C) \cdot t_{clock} \cdot I_j \quad (6)$$

The state of charge at time $t_0$ is corrected so that an absolute value $\Delta T_{diff}$ ($=|\Delta T_{real} - \Delta T_{calc}|$) of a difference between an actual measurement temperature increase amount $\Delta T_{real}$ based on the temperature measurement value of the secondary cell from time $t_0$ to time $t_1$ and a calculated temperature increase amount $\Delta T_{calc}$ of the secondary cell from time $t_0$ to time $t_1$, which is calculated based on at least the value of ($\partial E_{emf}/\partial T$) for which the value of the state of charge is set as the variable, the temperature measurement value of the secondary cell, and the current measurement value of the secondary cell, becomes a second predetermined value (where the second predetermined value<a first predetermined value), when the absolute value $\Delta T_{diff}$ exceeds the first predetermined value.

Specifically, the temperature determination unit 54 subsequently reads the previous and current temperature measurement values from the temperature memory 22, calculates the actual measurement temperature increase amount $\Delta T_{real}$, and compares the actual measurement temperature increase amount $\Delta T_{real}$ with the temperature increase amount $\Delta T_{calc}$ calculated by Expressions (5) and (6) by the temperature calculation unit 53. When the absolute value $\Delta T_{diff}$ ($=|\Delta T_{real} - \Delta T_{calc}|$) of the difference between the actual measurement temperature increase amount $\Delta T_{real}$ and the calculated temperature increase amount $\Delta T_{calc}$ is equal to or less than the first predetermined value (in the embodiment, for example, the first predetermined values is set to 0.05° C.), the SOC calculation unit 55 calculates the value of the current SOC from the current integrated value of the current integration unit 33 and the value $SOC_{memory}$ of the SOC stored in the SOC memory 56 and records the calculated values as the $SOC_{memory}$ in the SOC memory 56. Specifically, the SOC calculation unit 55 records the value of the SOC(80) in which "j=80" is set in Expression (6) as a new $SOC_{memory}$ in the SOC memory 56. The current integration unit 33 resets the current integrated value to 0 at this time. Thus, the occurrence of the error in the calculation of the state of charge by the current integration can be cancelled.

On the other hand, when the value of $\Delta T_{diff}$ exceeds the first predetermined value, the temperature determination unit 54 instructs the temperature calculation unit 53 to perform recalculation. The temperature calculation unit 53 recalculates the calculated temperature increase amount $\Delta T_{calc}$ by Expressions (5) and (6), when an SOC value ($SOC_{calc-A}$) which is (1+k) times the value $SOC_{memory}$ of the SOC stored in the SOC memory 56 is set to SOC(j) [where j=1] and when an SOC value ($SOC_{calc-B}$) which is (1−k) times the value $SOC_{memory}$ of the SOC stored in the SOC memory 56 is set to SOC(j) [where j=1]. Here, "k=0.01" is set, but the embodiment of the present disclosure is not limited to this value. Then, the temperature determination unit 54 re-compares the two calculated temperature increase amounts $\Delta T_{calc}$ calculated by the temperature calculation unit 53 with the actual measurement temperature increase amount $\Delta T_{real}$. Here, when $\Delta T_{diff}$ is equal to or less than the first predetermined value, the SOC value ($SOC_{calc-A}$ or $SOC_{calc-B}$) which is a basis of the relevant calculated temperature increase amount $\Delta T_{calc}$ is considered as the $SOC_{t-0}$ at time $t_0$ (that is, the state of charge at time $t_0$ is corrected). When $\Delta T_{diff}$ is equal to or less than the first predetermined value for both the two calculated temperature increase amounts $\Delta T_{calc}$, $SOC_{calc-A}$, or $SOC_{calc-B}$ in which the smaller value of $\Delta T_{diff}$ can be obtained may be considered as the $SOC_{t-0}$ at time $t_0$ (that is, the state of charge at time $t_0$ is corrected). Further, when $\Delta T_{diff}$ is greater than the first predetermined value for both the two calculated temperature increase amounts $\Delta T_{calc}$, the above-described calculation may be repeated in 2k, 3k, 4k, and the like. The value of the current SOC is calculated based on the SOC value considered as the $SOC_{t-0}$ at time $t_0$ obtained in this way, and this value is recorded as a new $SOC_{memory}$ in the SOC memory 56. Specifically, a value of the SOC(80) in which "j=80" is set in Expression (6) is recorded as a new $SOC_{memory}$ in the SOC memory 56. The current integration unit 33 resets the current integrated value to 0 at this time. Thus, the occurrence of the error in the calculation of the state of charge by the current integration can be cancelled.

Thereafter, the previous current values corresponding to the 80 times of the clock stored in the current memory 32 are deleted. Further, the old temperature data between the two pieces of temperature data stored in the temperature memory 22 is deleted. The current values corresponding to the maximum 80 times of the clock are stored in the current memory 32 and two pieces of temperature data are regularly stored in the temperature memory 22. Further, the contents of the SOC memory 56 are updated every 80 times of clock.

SOC display for a user may be performed based on the value of the SOC calculation unit 55 every clock or may be performed based on the value of the SOC memory 56 every 80 counts.

By performing this process on each secondary cell 61, the SOC of all of the secondary cells 61 of the cell pack 60 can be estimated with high accuracy. When an increase in a circuit for calculation is not preferable, the process may be performed on each secondary cell 61 by shifting the clock. That is, the counter 12 corresponding to each secondary cell 61 is provided, and a time of count-up of the first secondary cell and a time of count-up of the second secondary cell may be separated by, for example, two clocks. At this time, in the current memory 32, the temperature memory 22, the SOC memory 56, and the current integration unit 33, a storage region in which the values of all of the secondary cells are stored is necessary.

As described above, in the method of estimating the state of charge of the secondary cell, the state-of-charge estimation device, a cell pack, and the electronic apparatus according to the first embodiment, the value of ($\partial E_{emf}/\partial T$) is calculated in advance, and the state of charge is calculated based on at least the value of ($\partial E_{emf}/\partial T$) for which a value of the state of charge is set as a variable, the temperature measurement value of the secondary cell, and the current measurement value of the secondary cell. That is, the state of charge is estimated directly from the measurement temperature change of the secondary cell, unlike a technology of the related art for estimating a state of charge by measuring an open voltage of the secondary cell. Therefore, it is not necessary for the secondary cell to remain unused for several hours and, an error rarely occurs in the calculation of the start of charge even when the secondary cell is frequently charged and discharged before a full discharge state or a full charge state. In the first embodiment, at the time of drive in which it is difficult to calculate an electromotive force of the secondary cell, the state of charge can be estimated. Further, the state of charge can reliably be estimated even in the secondary cell in which a change of the electromotive force to the state of charge is small. It is also possible to obtain the advantage of performing the calculation relatively easily.

Since combination with the current integration is performed, the estimated value of the state of charge can be also shown normally for a user.

Second Embodiment

Figure 2B:
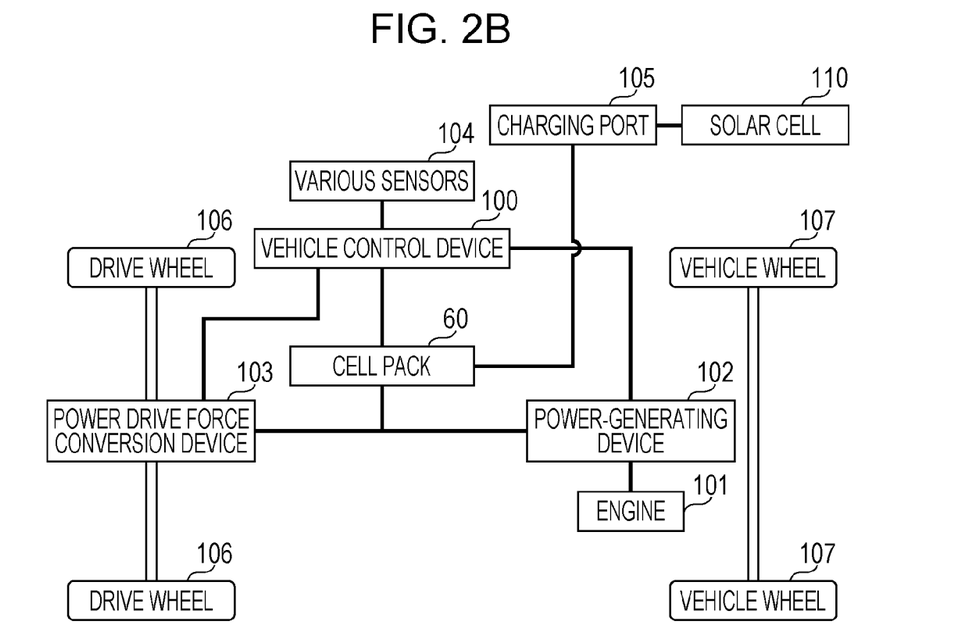

A second embodiment of the present disclosure relates to an electric vehicle, and specifically, to an electric automobile. FIG. 2B is a diagram illustrating the configuration of a hybrid vehicle according to the second embodiment.

The electric vehicle according to the second embodiment is an electric vehicle that includes a secondary cell 61 and the state-of-charge estimation device 10 calculating a state of charge of the secondary cell 61, as described in the first embodiment. Specifically, the electric vehicle includes the cell pack 60 according to the first embodiment.

The electric vehicle according to the second embodiment is an automobile that uses power generated in a power-generating device 102 driven by an engine 101 as a part or to temporarily accumulate the power in the cell pack 60 and uses the power from the cell pack 60 and which is driven by a power drive force conversion device 103. The electric vehicle includes, for example, a vehicle control device 100, various sensors 104, a charging port 105, drive wheels 106, and vehicle wheels 107.

The electric vehicle according to the second embodiment drives using the power drive force conversion device 103 as a power source. The power drive force conversion device 103 includes, for example, a driving motor. For example, the power drive force conversion device 103 is operated by the power of the cell pack 60 and a rotating force of the power drive force conversion device 103 is transferred to the drive wheels 106. Any one of an alternating-current motor and a direct-current motor can be applied as the power drive force conversion device 103. The various sensors 104 control the number of rotations of the engine through the vehicle control device 100 or control the degree of openness (the degree of throttle openness) of a throttle valve (not illustrated). The various sensors 104 include a speed sensor, an acceleration sensor, and an engine rotation number sensor. The rotating force of the engine 101 can be transferred to the power-generating device 102, and thus the power generated by the rotating force in the power-generating device 102 is accumulated in the cell pack 60.

When the electric vehicle is decelerated by a braking mechanism (not illustrated), a resistance force at the time of the deceleration is added as a rotating force to the power drive force conversion device 103 and regenerative power generated by the rotating force in the power drive force conversion device 103 is accumulated in the cell pack 60. Further, the cell pack 60 can receive the power from the solar cell 110 using the charging port 105 as an input port and receive the power from a commercial power source to accumulate the power. Alternatively, the power accumulated in the cell pack 60 can be supplied to the outside using the charging port 105 as an output port.

Although not illustrated, an information processing device that performs information processing based on information from the cell pack 60 is provided. Specifically, the information processing device displays the state of charge of the secondary cell 61 obtained based on the method of estimating the state of charge of the secondary cell, as described in the first embodiment.

A series hybrid vehicle that drives by the power drive force conversion device 103 using the power generated by the power-generating device 102 driven by the engine 101 and the power temporarily accumulated in the cell pack 60 has been described. However, a parallel hybrid vehicle may be configured which appropriately switches and uses the three systems in which the vehicle drives only by the engine 101 using any one of the outputs of the engine 101 and the power drive force conversion device 103 as a driving source only by the engine 101, drives only by the power drive force conversion device 103, and drives by both the engine 101 and the power drive force conversion device 103. Further, a vehicle may be configured which drives only by a driving motor without using an engine.

Third Embodiment

A third embodiment of the present disclosure relates to a method of estimating a state of charge of a secondary cell with the first and second configurations. Here, ($\partial V_{OC}/\partial T$) of a secondary cell is a state amount which is proportional to an entropy change in a Gibbs energy change of the secondary cell and is a basic characteristic indicating a chemical target state of the secondary cell.

In a method of measuring ($\partial V_{OC}/\partial T$) of the secondary cell according to the third embodiment, when a temperature change of the secondary cell is equal to or less than a temperature measurement limit of a temperature measurement device and when an open voltage change of the secondary cell is equal to or less than a voltage measurement limit of a voltage measurement device (the method of estimating a state of charge of the secondary cell with the first configuration and the like) or a diffusion reaction of lithium ions does not occur (the method of estimating a state of charge of the secondary cell with the second configuration and the like), an open voltage $V_{OC}$ of the secondary cell is measured by the voltage measurement device, the temperature T of the secondary cell is measured by the temperature measurement device, and the differential coefficient ($\partial V_{OC}/\partial T$) of the open voltage $V_{OC}$ of the secondary cell for which the temperature T of the secondary cell is set as a variable is calculated based on the open voltage measurement result and the temperature measurement result. The value of ($\partial E_{emf}/\partial T$) in the first embodiment is calculated based on ($\partial V_{OC}/\partial T$) obtained in this way.

Figure 5:
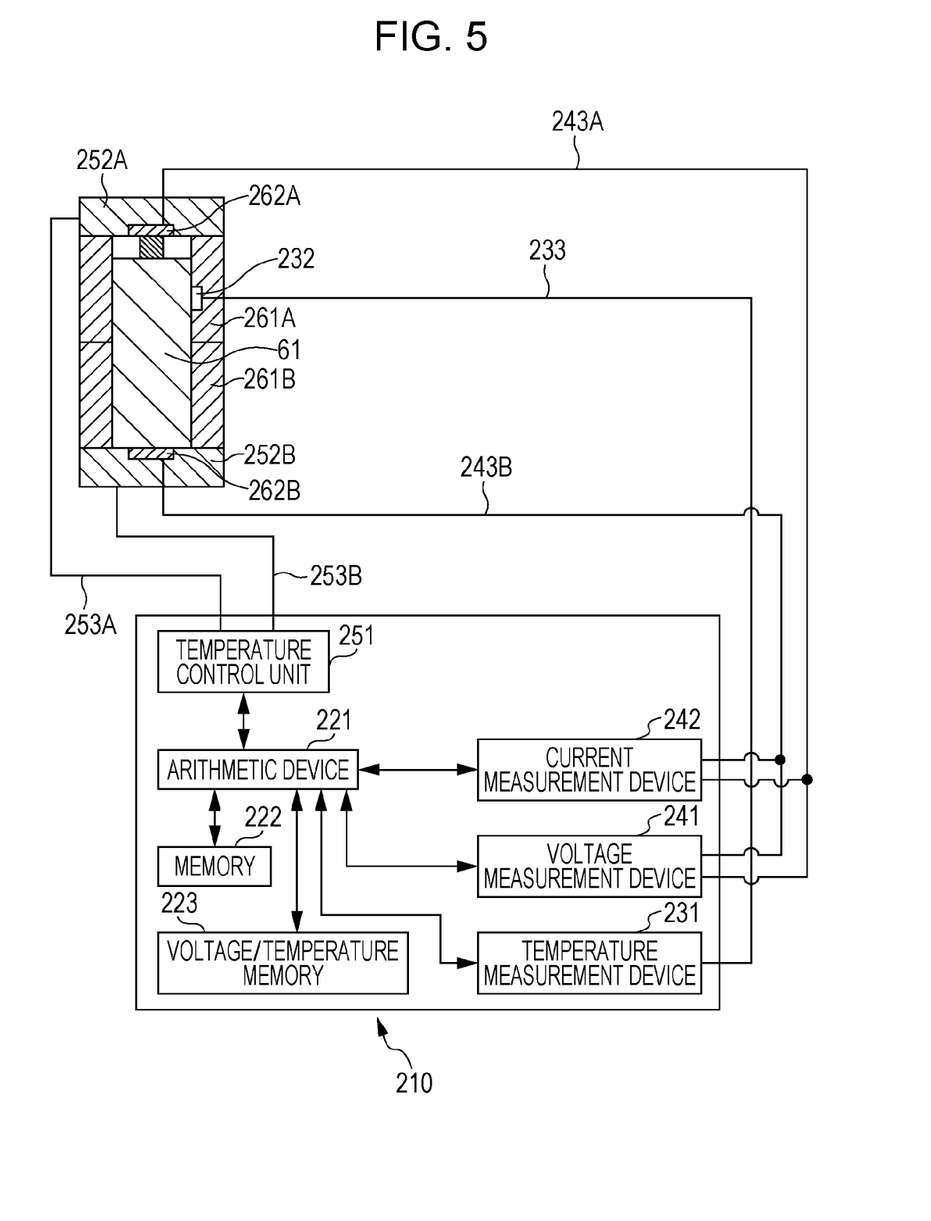
FIG. 5 is a conceptual diagram illustrating a measurement device of $(\partial V_{OC}/\partial T)$ of a secondary cell according to the third embodiment.

As illustrated in the conceptual diagram of FIG. 5, a ($\partial V_{OC}/\partial T$) device 210 of a secondary cell according to the third embodiment is a ($\partial V_{OC}/\partial T$) measurement device of a secondary cell including a secondary cell or a lithium-ion secondary cell and includes: a voltage measurement device (voltage measurement circuit) 241 that measures the open voltage $V_{OC}$ of the secondary cell; a temperature measurement device (temperature measurement circuit) 231 that measures a temperature of the secondary cell; a temperature control unit that controls the temperature of the secondary cell; an arithmetic device 221 that calculates a differential coefficient ($\partial V_{OC}/\partial T$) of the open voltage $V_{OC}$ of the secondary cell for which the temperature T of the secondary cell is set to as a variable; and a current measurement device (current measurement circuit) 242 that measures a charging or discharging current of the secondary cell.

When the temperature control unit considers that the temperature change of the secondary cell is equal to or less than a temperature measurement limit of the temperature measurement device 231 and when the open voltage change of the secondary cell is equal to or less than the voltage measurement limit of the voltage measurement device 241 [the ($\partial V_{OC}/\partial T$) measurement device of the secondary cell configured to perform the method of estimating the state of charge of the secondary cell with the first configuration and the like] or the diffusion reaction of lithium ions does not occur by the temperature control unit [the ($\partial V_{OC}/\partial T$) measurement device of the secondary cell configured to perform the method of estimating the state of charge of the secondary cell with the second configuration and the like], the open voltage $V_{OC}$ of the secondary cell is measured by the voltage measurement device 241, the temperature T of the secondary cell is measured by the temperature measurement device 231, ($\partial V_{OC}/\partial T$) is calculated based on the open voltage measurement result and the temperature measurement result by the arithmetic device 221. The value of ($\partial E_{emf}/\partial T$) can be calculated based on ($\partial V_{OC}/\partial T$) obtained in this way.

Specifically, the ($\partial V_{OC}/\partial T$) device 210 includes the voltage measurement device (voltage measurement circuit) 241, the current measurement device (current measurement circuit) 242, the temperature measurement device (temperature measurement circuit) 231, temperature control units 251, 252A, 252B, and the arithmetic device 221. Here, specifically, the temperature measurement device 231 includes a temperature measurement device 232 that comes into contact with the outer surface of the secondary cell 61 and measures the temperature of the secondary cell 61. The temperature measurement device 231 and the temperature measurement device 232 are connected to each other by a wiring 233. The secondary cell 61 is contained in containers 261A and 261B heat-insulating the secondary cell 61 from the outside environment. The containers 261A and 261B are divided into two pieces to accommodate and extract the secondary cell 61. The temperature measurement device 232 is mounted on the containers 261A and 261B. The temperature control unit includes Peltier elements 252A and 252B disposed in the upper and lower portions of the containers 261A and 261B and a temperature control unit (temperature control circuit) 251 connected via the Peltier elements 252A and 252B and writings 253A and 253B. The voltage measurement device 241 and the current measurement device 242 are connected to contact terminal portions 262A and 262B disposed in the upper and lower portions of the containers 261A and 261B via wirings 243A and 243B. The contact terminal portions 262A and 262B come into contact with the positive and negative electrodes of the secondary cell 61. The arithmetic device 221 includes a CPU, a memory 222 that stores various programs and data, and a voltage/temperature memory 223 that stores a voltage measurement value and a temperature measurement value.

A voltage measurement device in which a voltage measurement limit is $1 \times 10^{-6}$ volts is used as the voltage measurement device 241. A temperature measurement device in which a temperature measurement limit is $1 \times 10^{-2 \circ}$ C. is used as the temperature measurement device 231. In the third embodiment, ($\partial V_{OC}/\partial T$) relevant to the state of charge of the secondary cell 61 is calculated.

In the measurement of ($\partial V_{OC}/\partial T$) of the secondary cell 61, for example, the secondary cell 61 is first charged fully. Specifically, 18650 type which is a cylindrical type cell is used as the secondary cell 61. In the full charge state, a discharge capacity is, for example, 2000 mAh.

Figure 6A:
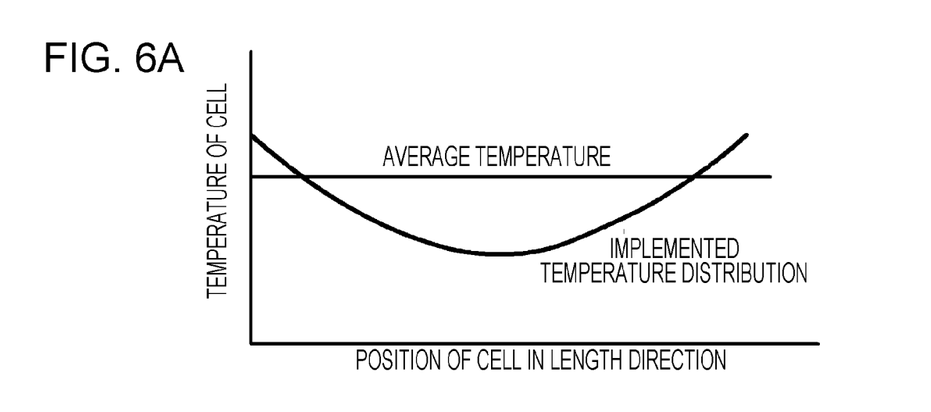
FIGS. 6A, 6B, and 6C are a diagram schematically illustrating a temperature distribution of the secondary cell in a length direction thereof, a diagram schematically illustrating an open voltage distribution of the secondary cell in the length direction, and a diagram schematically illustrating a state-of-charge dependency of $(\partial V_{OC}/\partial T)$, respectively.
Figure 6B:
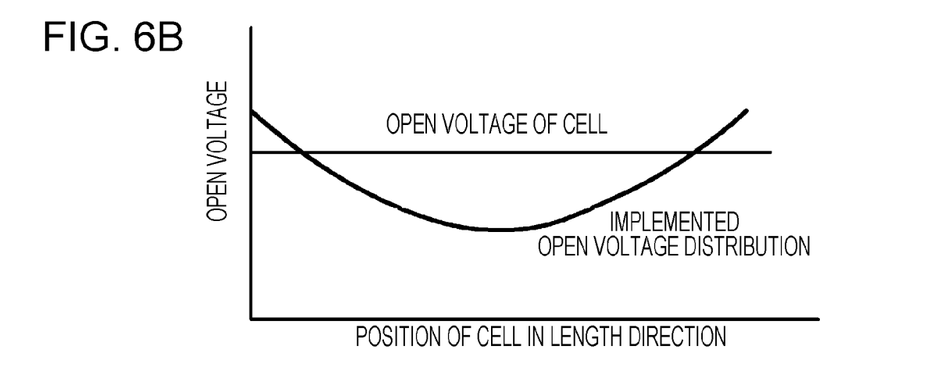

The temperature control unit is set so that the temperature of the secondary cell 61 becomes, for example, 10° C. In this case, actually, as illustrated in FIG. 6A, a temperature distribution in the length direction of the secondary cell 61 is generated. In a case of the cylindrical type cell, an electrode is wound in the inside. As illustrated in FIG. 6B, the open voltage $V_{OC}$ of the secondary cell 61 becomes a value corresponding to an average value of the temperature distribution. A temperature distribution in a normal state can be easily calculated using, for example, a commercially available thermo-fluid analysis program such as ANSYS CFD, CD-adapco STAR-CCM+, Autodesk Simulation CFD, FLOW-3D. Therefore, in regard to the set temperatures of the Peltier elements 252A and 252B, the calculation of the average temperature of the secondary cell 61 is relatively easy.

When the temperature change of the secondary cell 61 is equal to or less than the temperature measurement limit (equal to or less than 0.01° C.) of the temperature measurement device 231 and the open voltage change of the secondary cell 61 is equal to or less than the voltage measurement limit (1 microvolt) of the voltage measurement device 241, the open voltage $V_{OC}$ is measured by the voltage measurement device 241 and the temperature T of the secondary cell 61 is measured by the temperature measurement device 231. Alternatively, when the diffusion reaction of lithium ions does not occur, the open voltage $V_{OC}$ is measured by the voltage measurement device 241 and the temperature T of the secondary cell 61 is measured by the temperature measurement device 231. A time taken until this state is about 24 hours to 48 hours, although the time depends on the specification of the secondary cell 61. Subsequently, the temperature control unit is set so that the temperature of the secondary cell 61 becomes, for example, 15° C. Then, when the temperature change of the secondary cell 61 is equal to or less than the temperature measurement limit (equal to or less than 0.01° C.) of the temperature measurement device 231 and the open voltage change of the secondary cell 61 is equal to or less than the voltage measurement limit (1 microvolt) of the voltage measurement device 241, the open voltage $V_{OC}$ is measured by the voltage measurement device 241 and the temperature T of the secondary cell 61 is measured by the temperature measurement device 231. Further, a time taken until this state is about 10 minutes to 30 minutes, although the time depends on the specification of the secondary cell 61. Subsequently, the temperature control unit is set so that the temperature of the secondary cell 61 is, for example, 20° C., 25° C., 30° C., 35° C., and 40° C., and the open voltage $V_{OC}$ and the temperature T of the secondary cell 61 are measured likewise. The measurement results of the open voltage $V_{OC}$ and the temperature T of the secondary cell 61 are stored in the voltage/temperature memory 223 under the control of the arithmetic device 221.

Based on the open voltage $V_{OC}$ and the temperature T of the secondary cell obtained in this way, the arithmetic device 221 calculates the following regression line according to the least-square method:

$$V_{OC} = k_1 \times T + k_0.$$

The obtained coefficient $k_1$ is the differential coefficient ($\partial V_{OC}/\partial T$) of the open voltage $V_{OC}$ of the secondary cell for which the temperature T of the secondary cell is set to as a variable and has a value from about $10^{-3}$ to about $10^{-4}$ (volt/C). A determination coefficient of the regression line is 0.99 or more (for example, 0.9998). The value of the open voltage $V_{OC}$ is in the range of 100 microvolts to 10 millivolts.

Since the high determination coefficient is obtained, a measurement time can be shortened. Therefore, for example, 10° C. and 40° C. are used as two points for the measurement and the inclination of the two points may be set as ($\partial V_{OC}/\partial T$). In a case in which a change of ($\partial V_{OC}/\partial T$) to the temperature is large or a case in which the accuracy is allowed to be reduced for some purpose, for example, there is no problem even when two points of 20° C. and 25° C. are used for measurement.

Next, the secondary cell 61 is extracted from the containers 261A and 261B and a given amount of discharge is performed using a discharging device (not illustrated). Here, for example, an amount of current (200 mAh) corresponding to 10% of the discharge capacity is discharged. Even after the discharge, the diffusion reaction of lithium ions continues. The secondary cell 61 is left indoors for 24 hours to 48 hours. After a state in which the diffusion reaction of lithium ions does not occur, the secondary cell 61 is accommodated in the containers 261A and 261B and the temperature control unit is set again so that the temperature of the secondary cell 61 is, for example, 10° C. Then, when the temperature change of the secondary cell 61 is equal to or less than the temperature measurement limit (equal to or less than 0.01° C.) of the temperature measurement device 231 and the open voltage change of the secondary cell 61 is equal to or less than the voltage measurement limit (1 microvolt) of the voltage measurement device 241, the open voltage $V_{OC}$ is measured by the voltage measurement device 241 and the temperature T of the secondary cell 61 is measured by the temperature measurement device 231. Alternatively, when the diffusion reaction of lithium ions does not occur, the open voltage $V_{OC}$ is measured by the voltage measurement device 241 and the temperature T of the secondary cell 61 is measured by the temperature measurement device 231. Further, as described above, the temperature control unit is set so that the temperature of the secondary cell 61 is, for example, 15° C., 20° C., 25° C., 30° C., 35° C., and 40° C., and the open voltage $V_{OC}$ and the temperature T of the secondary cell 61 are measured likewise. The measurement results of the open voltage $V_{OC}$ and the temperature T of the secondary cell 61 are stored in the voltage/temperature memory 223 under the control of the arithmetic device 221.

The above-described discharge of the second cell 61 and the measurement of the open voltage $V_{OC}$ and the temperature of the secondary cell 61 are repeated by an amount of current corresponding to, for example, 20%, 30%, . . . , and 90% of the discharge capacity. Then, the differential coefficient $(\partial V_{OC}/\partial T)$ of the open voltage $V_{OC}$ of the secondary cell for which the temperature T of the secondary cell is set to as a variable is calculated based on the open voltage measurement result and the temperature measurement result. Specifically, based on the obtained open voltage $V_{OC}$ and the obtained temperature T of the secondary cell, the arithmetic device 221 calculates the following regression line at each current flow rate (the state of charge of the secondary cell according to the least-square method:

$$V_{OC} = k_1 \times T + k_0.$$

Figure 6C:
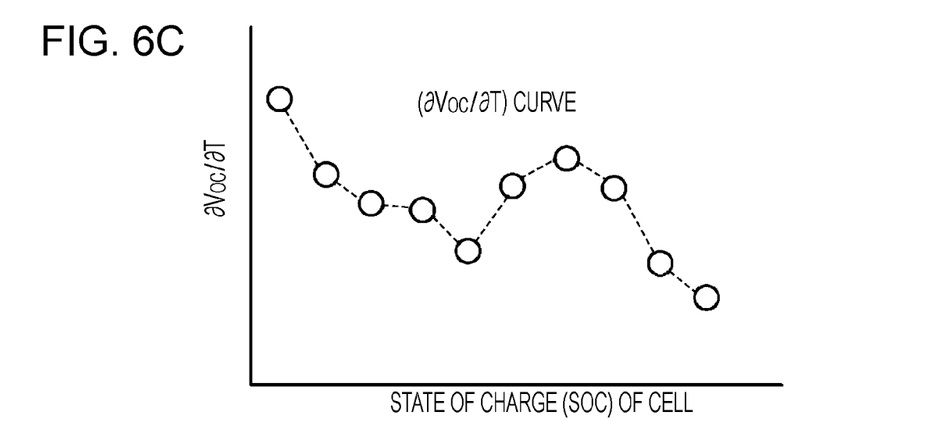

The obtained coefficient $k_1$ is the differential coefficient $(\partial V_{OC}/\partial T)$ of the open voltage $V_{OC}$ of the secondary cell for which the temperature T of the secondary cell is set to as a variable at each current flow rate (the state of charge of the secondary cell), as schematically illustrated in FIG. 6C. In this way, $(\partial V_{OC}/\partial T)$ relevant to the state of charge of the secondary cell can be obtained.

Here, the entropy change ΔS of the secondary cell can be expressed:

$$\Delta S = n \cdot F \cdot (\partial V_{OC}/\partial T),$$

where n is the number of electrons and F is the Faraday constant.

The dependency of the state of charge of $(\partial V_{OC}/\partial T)$ illustrated in FIG. 6C largely depends on a constituent material of the secondary cell. When the entropy change ΔS of the secondary cell is theoretically analyzed and a graph shape of the dependency of the start of charge of $(\partial V_{OC}/\partial T)$ is known in advance, data of accurate $(\partial V_{OC}/\partial T)$ can be obtained by fitting a measurement point of (T, $V_{OC}$). When it is difficult to perform the fitting, interpolation may be performed by spline or the like or more minute data may be acquired.

In the third embodiment, as described above, when the temperature change of the secondary cell is equal to or less than the temperature measurement limit of the temperature measurement device and the open voltage change of the secondary cell is equal to or less than the voltage measurement limit of the voltage measurement device or when the diffusion reaction of lithium ions does not occur, the open voltage and the temperature of the secondary cell are measured. Thus, the open voltage of the secondary cell can be measured with high accuracy, and thus $(\partial V_{OC}/\partial T)$ which is basic data used to calculate the entropy change can be consequently calculated with high accuracy. As described above, when the temperature change of the secondary cell is equal to or less than the temperature measurement limit of the temperature measurement device and the open voltage change of the secondary cell is equal to or less than the voltage measurement limit of the voltage measurement device or when the diffusion reaction of lithium ions does not occur, "$E_{emf} = V_{OC}$" is satisfied.

The preferred embodiments of the present disclosure have hitherto been described, but the present disclosure is not limited to the embodiments. The method of estimating the state of charge of the secondary cell and the configurations of the state-of-charge estimation device, the cell pack, and the electronic apparatus, and the electric vehicle in the embodiments are merely examples and may be appropriately modified. In the embodiments, only the lithium-ion secondary cell has been described as an example of the secondary cell. However, the secondary cell is not limited to the lithium-ion secondary cell.

Embodiments of the present disclosure can be configured as follows.

[1] Method of Estimating State of Charge

A method of estimating a state of charge of a secondary cell, includes: calculating a value of $(\partial E_{emf}/\partial T)$ in advance on the assumption that $E_{emf}$ is an electromotive force of the secondary cell and T is a temperature of the secondary cell; and calculating the state of charge based on at least a value of $(\partial E_{emf}/\partial T)$ for which a value of the state of charge is set as a variable, a temperature measurement value of the secondary cell, and a current measurement value of the secondary cell.

[2] In the method of estimating the state of charge of the secondary cell described in [1], the state of charge may be calculated not only based on the value of $(\partial E_{emf}/\partial T)$ for which the value of the state of charge is set as the variable, the temperature measurement value of the secondary cell, and the current measurement value of the secondary cell but also based on an internal resistance value of the secondary cell.

[3] The method of estimating the state of charge of the secondary cell described in [1] or [2] may further include calculating a state of charge at time $t_1$ based on a state of charge at time $t_0$ and a current measurement value of the secondary cell from time $t_0$ to time $t_1$; and correcting the state of charge at time $t_0$ so that an absolute value $\Delta T_{diff}$ ($=|\Delta T_{real} - \Delta T_{calc}|$ of a difference between an actual measurement temperature increase amount $\Delta T_{real}$ based on the temperature measurement value of the secondary cell from time $t_0$ to time $t_1$ and a calculated temperature increase amount $\Delta T_{calc}$ of the secondary cell from time $t_0$ to time $t_1$, which is calculated based on at least the value of $(\partial E_{emf}/\partial T)$ for which the value of the state of charge is set as the variable, the temperature measurement value of the secondary cell, and the current measurement value of the secondary cell, becomes a second predetermined value (where the second predetermined value<a first predetermined value), when the absolute value $\Delta T_{diff}$ exceeds the first predetermined value.

[4] In the method of estimating the state of charge of the secondary cell described in any one of [1] to [3], when a temperature change of the secondary cell is equal to or less than a temperature measurement limit of a temperature measurement device and an open voltage change of the secondary cell is equal to or less than a voltage measurement limit of a voltage measurement device, an open voltage of the secondary cell may be measured by the voltage measurement device, the temperature of the secondary cell may be measured by the temperature measurement device, and the value of $(\partial E_{emf}/\partial T)$ may be calculated based on the open voltage measurement result and the temperature measurement result.

[5] In the method of estimating the state of charge of the secondary cell described in any one of [1] to [3], the secondary cell may include a lithium-ion secondary cell. In a state in which a diffusion reaction of lithium ions does not occur, an open voltage of the secondary cell may be measured by a voltage measurement device, the temperature of the secondary cell may be measured by the temperature measurement device, and the value of $(\partial E_{emf}/\partial T)$ may be calculated based on the open voltage measurement result and the temperature measurement result.

[6] In the method of estimating the state of charge of the secondary cell described in [5], the state in which the diffusion reaction of lithium ions does not occur may be a state in which a temperature change of the secondary cell is equal to or less than a temperature measurement limit of the temperature measurement device and an open voltage change of the secondary cell is equal to or less than a voltage measurement limit of the voltage measurement device.

[7] In the method of estimating the state of charge of the secondary cell described in any one of [4] to [6], the voltage measurement device having the voltage measurement limit of $1 \times 10^{-6}$ volts and the temperature measurement device having the temperature measurement limit of $1 \times 10^{-2\circ}$ C. may be used.

[8] State-of-Charge Estimation Device

A state-of-charge estimation device that calculates a state of charge of a secondary cell includes: a storage unit that stores a value of $(\partial E_{emf}/\partial T)$ on the assumption that $E_{emf}$ is an electromotive force of the secondary cell and T is a temperature of the secondary cell; a temperature measurement device that measures the temperature of the secondary cell; a current measurement device that measures a current of the secondary cell; and an arithmetic device that calculates the state of charge based on at least the value of $(\partial E_{emf}/\partial T)$ for which a value of the state of charge is set as a variable, a temperature measurement value of the secondary cell, and a current measurement value of the secondary cell.

[9] Cell Pack

A cell pack includes: a secondary cell; and a state-of-charge estimation device that calculates a state of charge of the secondary cell. The state-of-charge estimation device includes a storage unit that stores a value of $(\partial E_{emf}/\partial T)$ on the assumption that $E_{emf}$ is an electromotive force of the secondary cell and T is a temperature of the secondary cell, a temperature measurement device that measures the temperature of the secondary cell, a current measurement device that measures a current of the secondary cell, and an arithmetic device that calculates the state of charge based on at least the value of $(\partial E_{emf}/\partial T)$ for which a value of the state of charge is set as a variable, a temperature measurement value of the secondary cell, and a current measurement value of the secondary cell.

[10] Electronic Apparatus

An electronic apparatus includes: a secondary cell; and a cell pack that includes a state-of-charge estimation device calculating a state of charge of the secondary cell. The state-of-charge estimation device includes a storage unit that stores a value of $(\partial E_{emf}/\partial T)$ on the assumption that $E_{emf}$ is an electromotive force of the secondary cell and T is a temperature of the secondary cell, a temperature measurement device that measures the temperature of the secondary cell, a current measurement device that measures a current of the secondary cell, and an arithmetic device that calculates the state of charge based on at least the value of $(\partial E_{emf}/\partial T)$ for which a value of the state of charge is set as a variable, a temperature measurement value of the secondary cell, and a current measurement value of the secondary cell.

[11] Electric Vehicle

An electric vehicle includes: a secondary cell; and a cell pack that includes a state-of-charge estimation device calculating a state of charge of the secondary cell. The state-of-charge estimation device includes a storage unit that stores a value of $(\partial E_{emf}/\partial T)$ on the assumption that $E_{emf}$ is an electromotive force of the secondary cell and T is a temperature of the secondary cell, a temperature measurement device that measures the temperature of the secondary cell, a current measurement device that measures a current of the secondary cell, and an arithmetic device that calculates the state of charge based on at least the value of $(\partial E_{emf}/\partial T)$ for which a value of the state of charge is set as a variable, a temperature measurement value of the secondary cell, and a current measurement value of the secondary cell.

The present disclosure contains subject matter related to that disclosed in Japanese Priority Patent Application JP 2012-120455 filed in the Japan Patent Office on May 28, 2012, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method, comprising:
  in a state-of-charge estimation device configured to estimate a state of charge of a secondary cell:
  measuring a temperature of the secondary cell using a temperature measurement device;
  calculating a value of to be stored in a storage unit, where $E_{emf}$ is an electromotive force of the secondary cell and T is the temperature of the secondary cell; and
  calculating the state of charge based on at least the stored value of $\partial E_{emf}/\partial T$ for which a value of the state of charge is set as a variable, a value of the measured temperature of the secondary cell, and a current measurement value of the secondary cell.

2. The method according to claim 1, wherein the state of charge is calculated based on an internal resistance value of the secondary cell.

3. The method according to claim 1, further comprising:
  calculating the state of charge at time $t_1$ based on a state of charge at time $t_0$ and the current measurement value of the secondary cell from time $t_0$ to time $t_1$;

calculating an actual measurement temperature increase amount $\Delta T_{real}$ based on the temperature measurement value of the secondary cell from time $t_0$ to time $t_1$;

calculating a temperature increase amount $\Delta T_{calc}$ of the secondary cell from time $t_0$ to time $t_1$ based on the value of $\partial_{emf}/\partial T$ for which the value of the state of charge is set as the variable; and correcting the state of charge at time $t_0$ such that an absolute value $\Delta T_{diff} = |\Delta T_{real} - \Delta T_{calc}|$, which is a difference between the actual measurement temperature increase amount $\Delta T_{real}$ and the calculated temperature increase amount $\Delta T_{calc}$ of the secondary cell from time $t_0$ to time $t_1$ becomes a second value in the event the absolute value $\Delta T_{diff}$ exceeds a first value, wherein the second value is less than the first value.

4. The method according to claim 1, further comprising:

for a temperature change of the secondary cell is equal to or less than a temperature measurement limit of the temperature measurement device and an open voltage change of the secondary cell is equal to or less than a voltage measurement limit of a voltage measurement device:

measuring an open voltage of the secondary cell by the voltage measurement device;

measuring the temperature of the secondary cell by the temperature measurement device; and calculating the value of $\partial E_{emf}/\partial T$ based on the measured open voltage and the measured temperature.

5. The method according to claim 4, wherein the voltage measurement limit of the voltage measurement device is $1 \times 10^{-6}$ volts and the temperature measurement limit of the temperature measurement device is $1 \times 10^{-2\circ}$ C.

6. The method according to claim 1, further comprising:

measuring, in a state that is lacking a diffusion reaction of lithium ions, an open voltage of the secondary cell by a voltage measurement device, and the temperature of the secondary cell by the temperature measurement device; and calculating the value of $\partial E_{emf}/\partial T$ based on the measured open voltage and the measured temperature, wherein the secondary cell includes a lithium-ion secondary cell.

7. The method according to claim 6, wherein the state in which the diffusion reaction of lithium ions does not occur is a state in which a temperature change of the secondary cell is equal to or less than a temperature measurement limit of the temperature measurement device and an open voltage change of the secondary cell is equal to or less than a voltage measurement limit of the voltage measurement device.

8. The method according to claim 1, further comprising:

calculating the state of charge at time $t_1$ based on the state of charge at time $t_0$ and the current measurement value of the secondary cell from time $t_0$ to time $t_1$;

calculating an actual measurement temperature increase amount based on the temperature measurement value of the secondary cell from time $t_0$ to time $t_1$;

calculating a temperature increase amount of the secondary cell from time $t_0$ to time $t_1$ based on the value of $\partial E_{emf}/\partial T$; and correcting the state of charge at time $t_0$ such that an absolute value, which is a difference between the actual measurement temperature increase amount and the calculated temperature increase amount of the secondary cell from time $t_0$ to time $t_1$ becomes a second in the event the absolute value exceeds a first value, wherein the second value is less than the first value.

9. The method according to claim 1, further comprising:

calculating a state of charge at time $t_1$ based on a state of charge at time $t_0$ and a current measurement value of the secondary cell from time $t_0$ to time $t_1$; and correcting the state of charge at time $t_0$ based on an actual measurement temperature increase amount from time $t_0$ to time $t_1$.

10. A state-of-charge estimation device configured to calculate a state of charge of a secondary cell, comprising:

a storage unit configured to store a value of $\partial E_{emf}/\partial T$ where $E_{emf}$ is an electromotive force of the secondary cell and $T$ is a temperature of the secondary cell;

a temperature measurement device configured to measure the temperature of the secondary cell;

a current measurement device configured to measure a current of the secondary cell; and an arithmetic device configured to calculate the state of charge based on at least the value of $\partial E_{emf}/\partial T$ for which a value of the state of charge is set as a variable, a temperature measurement value of the secondary cell, and a current measurement value of the secondary cell.

11. A cell pack, comprising:

a secondary cell; and a state-of-charge estimation device configured to calculate a state of charge of the secondary cell, wherein the state-of-charge estimation device includes:

a storage unit configured to store a value of $\partial E_{emf}/\partial T$, wherein $E_{emf}$ is an electromotive force of the secondary cell and $T$ is a temperature of the secondary cell;

a temperature measurement device configured to measure the temperature of the secondary cell;

a current measurement device configured to measure a current of the secondary cell; and an arithmetic device configured to calculate the state of charge based on at least the value of $\partial E_{emf}/\partial T$ for which a value of the state of charge is set as a variable, a temperature measurement value of the secondary cell, and a current measurement value of the secondary cell.

12. An electronic apparatus, comprising:

a secondary cell; and a cell pack that includes a state-of-charge estimation device configured to calculate a state of charge of the secondary cell, wherein the state-of-charge estimation device includes:

a storage unit configured to store a value of $\partial E_{emf}/\partial T$, where $E_{emf}$ is an electromotive force of the secondary cell and $T$ is a temperature of the secondary cell;

a temperature measurement device configured to measure the temperature of the secondary cell;

a current measurement device configured to measure a current of the secondary cell; and an arithmetic device configured to calculate the state of charge based on at least the value of $\partial E_{emf}/\partial T$ for which a value of the state of charge is set as a variable, a temperature measurement value of the secondary cell, and a current measurement value of the secondary cell.

13. An electric vehicle, comprising:

a secondary cell; and a cell pack that includes a state-of-charge estimation device configured to calculate a state of charge of the secondary cell, wherein the state-of-charge estimation device includes:

a storage unit configured to store a value of $\partial E_{emf}/\partial T$, where $E_{emf}$ is an electromotive force of the secondary cell and $T$ is a temperature of the secondary cell;

a temperature measurement device configured to measure the temperature of the secondary cell;
a current measurement device configured to measure a current of the secondary cell; and
an arithmetic device configured to calculate the state of charge based on at least the value of $\partial E_{emf}/\partial T$ for which a value of the state of charge is set as a variable, a temperature measurement value of the secondary cell, and a current measurement value of the secondary cell.

* * * * *